(12) United States Patent
Sipes, Jr.

(10) Patent No.: US 7,881,355 B2
(45) Date of Patent: Feb. 1, 2011

(54) SYSTEM AND METHOD FOR GENERATING INTENSE LASER LIGHT FROM LASER DIODE ARRAYS

(75) Inventor: Donald L. Sipes, Jr., Crystal Lake, IL (US)

(73) Assignee: Mind Melters, Inc., Crystal Lake, IL (US)

( * ) Notice: Subject to any disclaimer, the term of this patent is extended or adjusted under 35 U.S.C. 154(b) by 352 days.

(21) Appl. No.: 11/300,726

(22) Filed: Dec. 15, 2005

(65) Prior Publication Data

US 2008/0101429 A1    May 1, 2008

(51) Int. Cl.
*H01S 5/00* (2006.01)
(52) U.S. Cl. .................................................. 372/50.12
(58) Field of Classification Search ............... 372/50.12
See application file for complete search history.

(56) References Cited

U.S. PATENT DOCUMENTS

| | | | |
|---|---|---|---|
| 5,139,609 A | 8/1992 | Fields et al. | |
| 5,185,758 A | 2/1993 | Fan et al. | |
| 5,212,707 A * | 5/1993 | Heidel et al. | 372/50.23 |
| 5,229,883 A | 7/1993 | Jackson et al. | |
| 5,243,619 A | 9/1993 | Albers et al. | |
| 5,333,077 A | 7/1994 | Legar et al. | |
| 5,374,935 A * | 12/1994 | Forrest | 342/368 |
| 5,568,577 A | 10/1996 | Hardy, Jr. | |
| 5,579,422 A | 11/1996 | Head et al. | |
| 5,594,752 A | 1/1997 | Endriz | |
| 5,790,310 A | 8/1998 | Huang | |
| 5,793,783 A | 8/1998 | Endriz | |
| 5,802,092 A | 9/1998 | Endriz | |
| 5,805,748 A | 9/1998 | Izawa | |
| 5,887,096 A | 3/1999 | Du et al. | |
| 6,028,722 A | 2/2000 | Lang | |
| 6,101,199 A | 8/2000 | Wang et al. | |
| 6,151,168 A | 11/2000 | Goering et al. | |
| 6,222,864 B1 * | 4/2001 | Waarts et al. | 372/50.23 |
| 6,377,410 B1 | 4/2002 | Wang et al. | |
| 6,556,352 B2 | 4/2003 | Wang | |
| 6,683,727 B1 * | 1/2004 | Goring et al. | 359/639 |

(Continued)

FOREIGN PATENT DOCUMENTS

EP    1 059 713 A2    12/2000

(Continued)

OTHER PUBLICATIONS

Preliminary Report on Patentability dated Aug. 2, 2008, for co-pending International Application Serial No. PCT/US2006/045210.

(Continued)

*Primary Examiner*—Minsun Harvey
*Assistant Examiner*—Marcia A. Golub-Miller
(74) *Attorney, Agent, or Firm*—Leydig, Voit & Mayer

(57) ABSTRACT

Laser modules using two-dimensional laser diode arrays are combined to provide an intense laser beam. The laser diodes in a two-dimensional array are formed into rows and columns, and an optical assembly images light generated by laser diodes in a column into an optical fiber. The laser light outputs of the laser modules are combined by a spectral combiner into an optical fiber to form an intense laser beam.

18 Claims, 12 Drawing Sheets

U.S. PATENT DOCUMENTS

| | | | |
|---|---|---|---|
| 6,950,573 B2 * | 9/2005 | Ota et al. | 385/32 |
| 7,010,194 B2 * | 3/2006 | Anikitchev et al. | 385/36 |
| 7,079,566 B2 * | 7/2006 | Kido et al. | 372/101 |
| 2003/0099267 A1 | 5/2003 | Henning et al. | |
| 2006/0018356 A1 | 1/2006 | Voss et al. | |
| 2007/0195850 A1 * | 8/2007 | Schluter et al. | 372/50.124 |
| 2008/0019010 A1 * | 1/2008 | Govorkov et al. | 359/641 |

FOREIGN PATENT DOCUMENTS

| | | |
|---|---|---|
| EP | 1 359 443 A | 5/2003 |
| EP | 1 619 765 A1 | 1/2006 |
| JP | 2000-098191 * | 4/2000 |
| WO | WO 02/50599 A | 6/2002 |

OTHER PUBLICATIONS

Response to Written Opinion filed on Nov. 12, 2007 for co-pending International Application Serial No. PCT/US2006/045210.

* cited by examiner

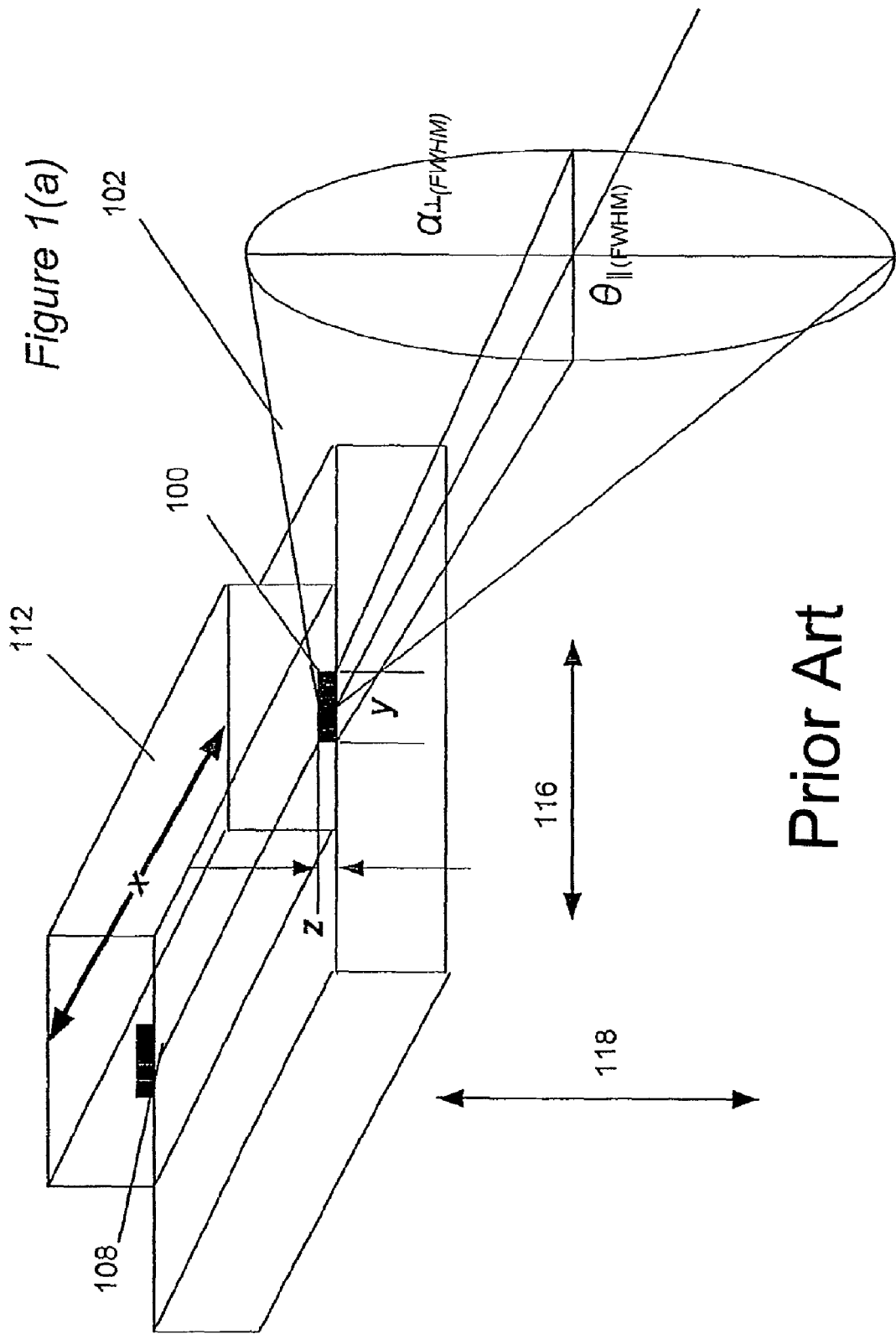

SYSTEM AND METHOD FOR GENERATING INTENSE LASER LIGHT FROM LASER DIODE ARRAYS

TECHNICAL FIELD

The present invention relates to lasers, and more particular to optical configurations to effectively couple the outputs of a plurality of individual laser elements, such as laser diodes, into optical fibers to provide high efficiency transmission of power through the optical fiber.

BACKGROUND OF THE INVENTION

The compact size and high efficiency of semiconductor laser diodes make them the ideal candidates for applications requiring concentrated and spectrally pure laser light sources. Applications such as optical storage, low end printing and telecommunications that once used many different types of laser sources, now only use semiconductor laser diode sources once these diode laser sources with the required characteristics were successfully developed. The primary reason that semiconductor laser diodes have these very useful characteristics is that the excited or pumped laser area can be made very small through the use of semiconductor fabrication techniques such as photolithography and epitaxial layer growth. Due to the small lasing area, the gain and optical intensity, which are the two main ingredients necessary for efficient conversion of excited atoms in the lasing medium to lasing photons, the efficiency of a laser diode can be very high. This effect produces a laser source of high brightness: that is, a source of a certain power with relatively low beam divergence for its wavelength. Brightness can either be defined in terms of its Lagrange invariant, the area of the emitting light source times the solid angle of the divergence of the light from the source, or in the case of Gaussian beams, the M2 parameter.

Nevertheless, this primary advantage of semiconductor laser diodes—small lasing volumes—becomes a disadvantage when scaling these devices to higher powers, however. Single $TEM_{oo}$ mode operation near the diffraction limit requires lasing modal dimensions (laser diode stripe width) to be typically less than 3-5 microns. As the power extracted from these lasing dimensions is increased, optical facet damage and other power related damage mechanisms usually limit the available power from these devices to be less than 500 mW. As the laser diode stripe width is increased to about 100 microns, powers in excess of ten (10) Watts can be achieved but at much reduced beam quality. Such output from one laser diode stripe is significantly inadequate for many applications in terms of both power level and beam quality. For example, applications in the of high-power processing of materials such as welding and the cutting and heat treating of materials such as metals, require power levels in the range of 1 kW to 5 kW with beam qualities equivalent to the output of a 200-400 microns by 0.14-0.22 numerical aperture (NA) optical fiber.

The need to scale the output of these semiconductor laser diodes to higher powers while maintaining beam quality has led to several approaches. The first is the well understood and documented approach to use these laser diodes to pump a solid state gain material such as NdYAG. In this approach, what would be the lower brightness of an array of incoherent semiconductor laser diodes is converted to the near $M^2$ of 1.0 $TEM_{oo}$ output of the laser diode pumped solid state laser. Another approach is to fiber couple the output of many individual laser diodes or laser diode bars to cladding pump a rare earth doped fiber laser. Near diffraction limited $M^2$ values of <1.1 have been achieved with power levels greater than 800 W in a Yb doped double clad fiber laser.

Many applications such as material processing and solid state laser pumping require beam qualities much less than diffraction-limited, and much attention has been given to the use of beam shaping and steering techniques to improving the quality of the stacked laser diode array bars themselves. Most of these efforts have focused on beam shaping and steering techniques that treat the laser bar emitter as a single wide source (greater than 19% fill factor) of 5 to 10 mm in width. Devices using these techniques have been widely published, and devices producing approximately 600 Watts in a 600 µm 0.22 NA fiber are commercially available. Earlier techniques which utilize individual 100 µm-wide laser emitters have been published, which use either individual laser diode emitters aligned with the devices oriented perpendicular to the epitaxially grown diode junction along an arc, or individual laser diode emitters aligned in a single bar (less than 21% fill factor) that are individually collimated and passed through a 90° image rotating prism such that their fast axis directions become co-linear. While this technique produced diode focusing and fiber coupling with good quality, this technique was confined to single laser diode bars, and the resultant output levels fall far short of what is required for high-power processing applications. Also, it has been through the development of high power broad area emitters for the telecommunications industry, that high power bars with less than 21% fill factors have recently become available with sufficient lifetimes for them to be practical for industrial applications.

SUMMARY OF THE INVENTION

In view of the foregoing, it is an object of the invention to provide a way to effectively combine the output of a relatively large number of laser diodes or similar laser sources to achieve high brightness, efficient focusing, and fiber coupling to generate an intense laser beam with desired high power level and beam quality.

This object is achieved by the apparatus and method of the invention, which utilizes two-dimensional laser arrays, such as stacked laser diode bars, and effectively combines the output from each two-dimension laser arrays into one or more optical fibers to achieve the desired intensity and beam quality. In accordance with a feature of the invention, the laser elements, such as laser diodes, are arranged in rows and columns, with the fast axes of the laser elements in the column direction, and the outputs of laser elements in each column of the array are combined and imaged into the entrance end of one optical fiber. By combining the outputs from the laser elements in one column into one fiber, a summed beam with the brightness in the fast axis direction substantially equal or close to the brightness in the slow axis direction can be achieved, thus providing improved beam quality. The outputs of the two-dimensional lasers carried by optical fibers may be combined by techniques including fiber combination and spectral combination to result in a high-power laser beam with good beam quality carried by an output optical fiber.

The invention provides for the preservation of the brightness of individual emitters in a 2-D stacked array of laser diode bars and their efficient coupling into optical fiber. New structures for processing, steering, combining and focusing the individual emitters into optical fiber are disclosed. These aspects of the teaching allow for the realization of structures that afford for semiconductor laser diode arrays to be used in applications where only semiconductor laser pumped solid state lasers or other lasers had been used before, and also for the more efficient and cost effective pumping of solid state lasers and fiber lasers and amplifiers.

The advantages and other objects of the invention may be understood from the following detailed description of embodiments of the invention, with reference to the corresponding drawings, in which:

BRIEF DESCRIPTION OF THE DRAWINGS

FIG. 1(a) is a schematic diagram that illustrates the geometry of a single, broad area semiconductor laser diode having fast and slow axes;

DETAILED DESCRIPTION OF THE INVENTION

Figure 1B:
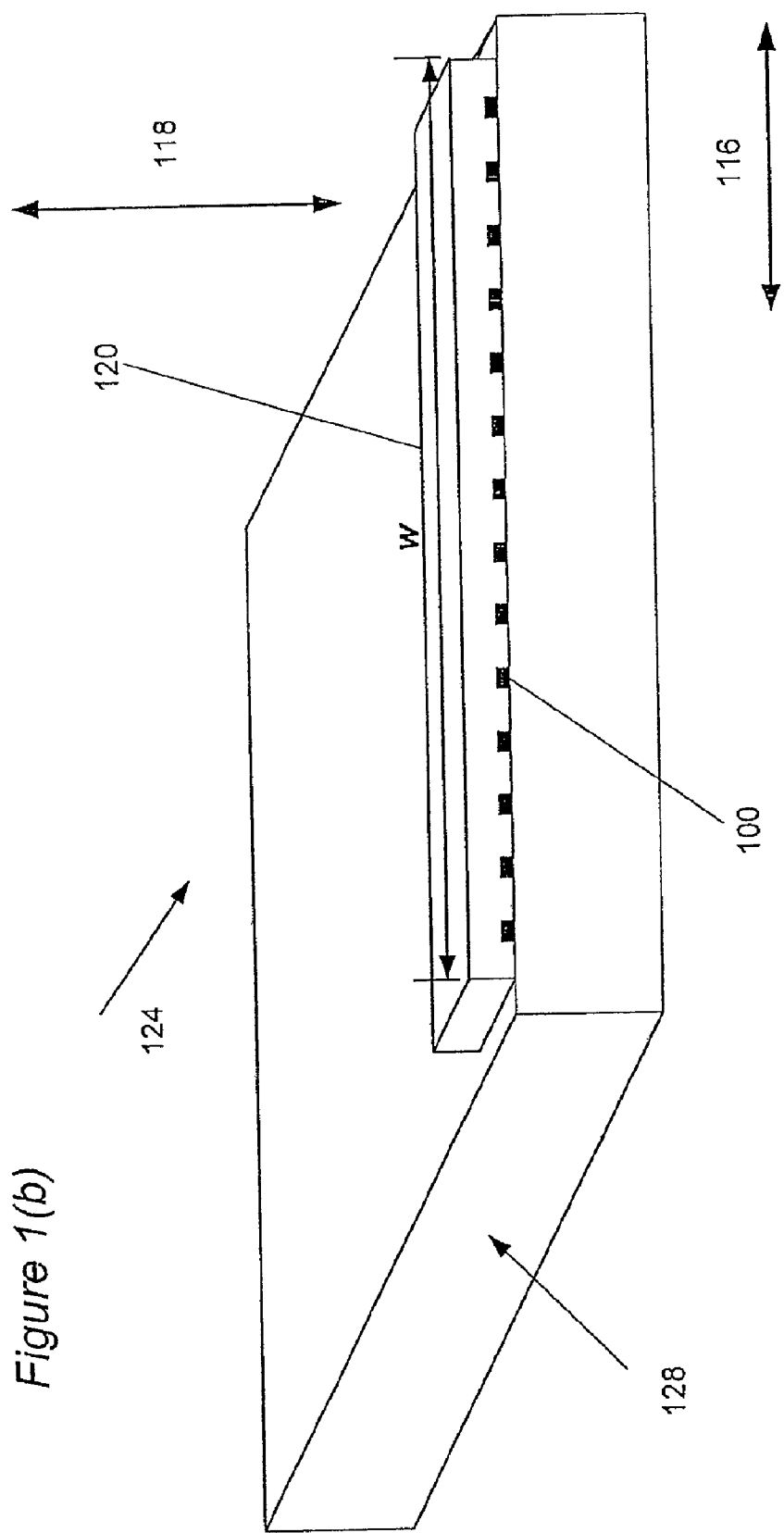
FIG. 1(b) is a schematic drawing that illustrates a laser bar with comprising multiple broad area semiconductor laser diodes in a one-dimensional array.

Turning now to the drawings, prior to describing the system and method of the invention, the structure of a laser diode and the properties of its output light is described first to facilitate an understanding and appreciation of the approach of the invention. As explained below, the invention is especially advantageous for combining the output beams from two-dimensional arrays of laser diodes to form an intense high-quality fiber-coupled beam. Nevertheless, the present invention is not limited to laser diodes, and can be applied to other forms of laser elements with a diffraction-limited small lasing area, including those that may be developed in the future. Unless specifically indicated otherwise, as used herein, the term "group" is intended mean one or more contiguous columns in a laser array.

FIG. 1(a) shows the typical geometry of a single broad area semiconductor laser diode 104 grown by epitaxial deposition. This device is characterized by an emitting or active region 100 of width y and thickness z and length x. This expitaxially grown and photolithographically defined region can be constructed in many different ways, but usually a single or multiple quantum well structure with an index guided waveguide in a material structure such as InGaAsP is a preferred embodiment. These devices are further defined as having growth layers 108, cleaved emitting facets 103, and are mounted on a heat removing substrate, or heat sink 112. The direction parallel to the semiconductor junction is referred to the slow axis 116. In this direction a stripe width y is defined photolithographically and the light emission from the aperture diverges in the far field 102 with the angle θ defined at full width half max (FWHM). In contrast, the direction perpendicular to the semiconductor junction is referred to as the fast axis 118. In this direction a stripe thickness z is defined epitaxially and the light emission from the aperture diverges in the far field 102 with the angle alpha (α) also defined at FWHM. For typical devices, z is around 1 micron and y is usually in the range of 50 to 200 microns and θ is about 10 degrees while α is about 50 degrees. More importantly, the $M_2$ in the slow axis varies from 10 to 20 for these stripe dimensions and in the fast axis, the $M_2$ is near 1.

FIG. 1(b) shows how a multiplicity of these broad area semiconductor laser diodes emitting regions 100 can be defined photolithographically to create a laser diode array bar 120 or multistripe bar. This multistripe bar 120 has parallel electrical connections 124 to spread the high current load, and is mounted on a cooling substrate 128, made up of either a conductive heat transfer plate, or a water cooled plate. A preferred embodiment for the cooling plate 128 uses a microchannel cooling plate. The slow non-diffraction-limited direction 116 can be defined as being parallel to the array of emitting regions 100, and the fast near-diffraction-limited direction 118 can be defined as being perpendicular to the array of emitting regions 100. The far field radiation pattern of the multistripe bar 120 is characterized as the linear sum of the far field radiation patterns 102 of the individual laser diode emitting regions 100 with each of the individual patterns 102 aligned axially with each of the laser diode emitting regions 100. Typical arrangements for these multistripe bars 120 are for total widths of 1 cm with between 10 and 30 evenly spaced laser diode emitting regions 100, and to have output powers in the range of 40 to 100 Watts.

Figure 1C:
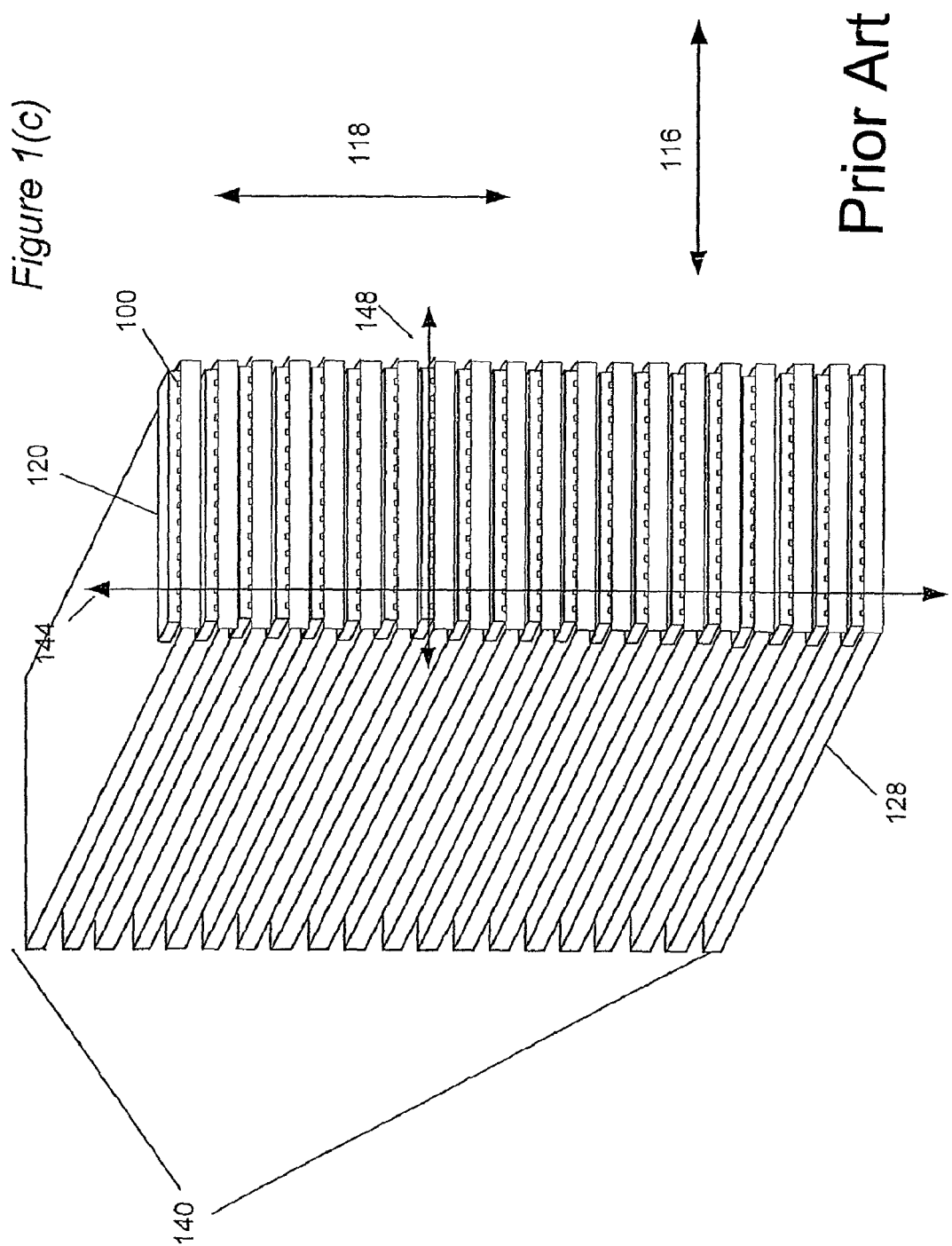
FIG. 1(c) is schematic drawing that illustrates a two-dimensional laser array formed by stacking a plurality of laser bars of the type shown in FIG. 1(b)

FIG. 1(c) shows how a multiplicity of these multistripe bars 120 can be arranged to create a two-dimensional ("2-D") stacked array 140. In this arrangement, the multistripe bars 120, mounted on their cooling substrate 128 with their parallel electrical connections 124, are placed with the multi stripe bars 120 aligned parallel to each other. This 2-D tacked array 140 can be characterized as having a "row" or "row" direction 148 where the individual emitters 100 in each multistripe bar 120 all have their slow axis directions 116 aligned in the same plane. This 2-D Stacked Array 140 can also be characterized as having a "column" or "column" direction 144 where columns individual emitters 100 in multiple multistripe bars 120 all have their fast axis directions 118 aligned in the same plane. The bars 120 are mounted such the laser diodes in each column of the 2-D array 140 are aligned with each other, preferably with a tolerance of 5 microns or less, to prevent significant degradation of the quality of the beam generated by combining the outputs of the laser diodes, as described in greater detail below. Each 2-D stacked array 140 may have 10 to 25 multistripe bars 120 and may generate output power in the range of 500 to 1500 Watts. Such a 2-D stacked array with columns and rows of laser diodes, with the fast axes of the laser diodes lined up along the column directions 144 and the slow axes of the laser diodes along the row directions 148, may be used as a building block to construct a system for high-brightness high-quality laser beam, as described in greater detail below.

In accordance with a feature of the invention, the outputs of the laser diodes in a 2-D array are effectively combined and coupled into one or more optical fibers to provide enhanced beam quality. In particular, the high-beam quality is achieved by imaging the outputs from the laser diodes in a given column into one optical fiber. By way of example, FIGS. 2(a) and 2(b) shows the fast and slow axis views of a configuration where the laser diode emitters 104 are aligned in a column 144 with the direction of their far field outputs 102 parallel to each other. This column 144 may be, for example, a column in the 2-D laser array shown in FIG. 1(c), but only one column, instead of all the columns in the 2-D array, is shown in FIGS. 2(a) and 2(b) for simplicity and clarity of illustration. As described above, all the laser diodes in such a column 144 are arranged such that their fast axes align with the column direction. In contrast, the laser diodes in a diode bar, such as the one shown in FIG. 1(b), have their fast axes perpendicular to the longitudinal direction, or the row axis, of the laser bar.

Figure 2:
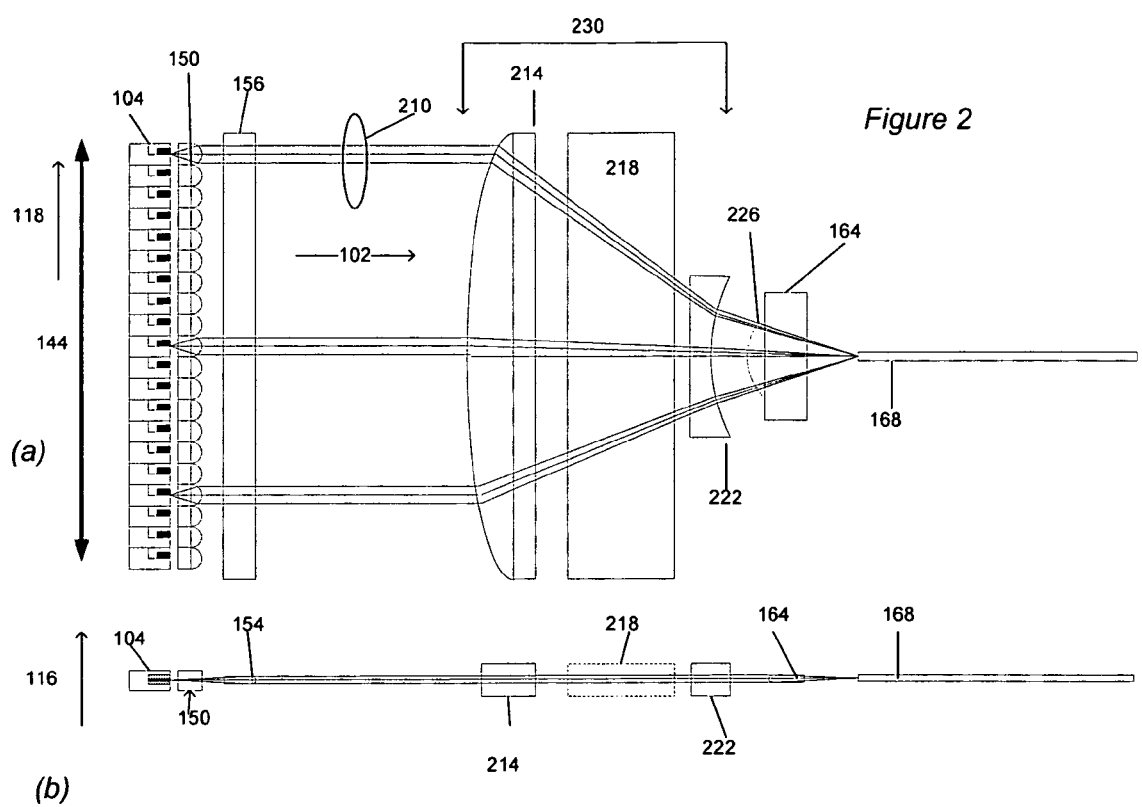
FIGS. 2(a) and 2(b) are schematic drawings illustrate two views along the fast and slow axis, respectively, for an configuration where the arrangement of individual laser diodes is aligned as a column in the fast axis such that the direction of their far field outputs aligned parallel to one another.

To image the light outputs from the column of laser diodes into an optical fiber, an optical assembly having multiple optical components is disposed between the laser diodes and the entrance end of the optical fiber. In the embodiment shown in FIG. 2, the fast and slow axis collimation optics 150 and 156 collimate the output of the column of 104 in the fast 118 and slow 116 axis directions respectively. These are typically, though not limited to, cylindrical optics. The fast axis focusing and beam steering of the individual collimated beams 210 are accomplished here through the use of a cylindrical optical assembly 230 of which the individual bundles of rays 210 passes through. This cylindrical optical assembly 230 is a multi element optical device consisting of at a minimum a positive effective focal length cylindrical lens 214 followed by a negative effective focal length cylindrical lens 222. Additional optical lenses 218 can be added between 214 and 222 for the reduction of aberrations. The output bundle of rays 226 is passed through the slow axis focusing lens 164 into the multimode optical fiber 168 consisting of the desired diameter and NA. The use of the cylindrical optical assembly accomplishes the dual function of focusing the fast axis direction of each beam 116 to the appropriate waist diameter and steering the multiplicity of beams 226 to the appropriate NA for efficient coupling to optical fiber or other optical systems in a way the preserves the brightness of the original laser diode emitting regions 100. For reasons of efficiency, aberration minimization, size, cost and complexity, many different optical collimating and focusing arrangements can be created with a wide array of optical technologies, including, but not limited to rod lenses, half rod cylinders, gradient index lenses and other multi-lens systems. In this regard, the embodiment shown in FIGS. 2a and b is designed such that it may be constructed using readily available lenses In accordance with the invention, the combination of good beam quality and high intensity in a fiber-coupled laser beam is achieved by combining, into one optical fiber, the light outputs from laser diodes that form a column with their fast axes aligned with the column direction. Generally, when coupling the output beam of a single laser diode into a multimode optical fiber, the limiting brightness for the single laser emitting region 100 is in the non diffraction limited slow axis direction 116. This brightness is defined as the product of the laser stripe width y times the far field angular divergence θ. Because optical fibers are typically symmetrical in cross sectional dimensions, it is advantageous in accordance with the invention to combine, as shown in FIGS. 2(a) and 2(b), the laser beams generated by a number of light sources 104 into an optical fiber such that the brightness of the summed beams in the near diffraction limited fast axis direction 118 (the stripe thickness z times the far field angular divergence α) is substantially equal or close to the brightness of the slow axis direction 116. This arrangement creates a Symmetric Brightness Unit (SBU) which preserves the brightness of the sum of the individual emitters 100. The number of sources 104 $n$ which can be coupled to form an SBU is simply the ratio of the fast direction brightness and slow direction brightness.

$$n = (y \times \theta)/(z \times \alpha)$$

The multimode fiber 168 of a desired diameter and NA is then chosen to match this SBU. Slightly increasing either the diameter of NA of 168 will work to lower the overall brightness of the SBU yet increase the efficiency of the fiber coupling. Optical aberrations such as Spherical aberration, coma, or variation in the mounting flatness of the laser diode bar 120 (referred to as "laser bar smile") can decrease the overall brightness of the SBU and require a larger multimode fiber 168 diameter or NA for comparable coupling efficiency. While coupling into optical fiber is a desired embodiment, this technique can also be applied where the focused and process beams are then coupled into another optical system such as a materials processing optical system.

Figure 3:
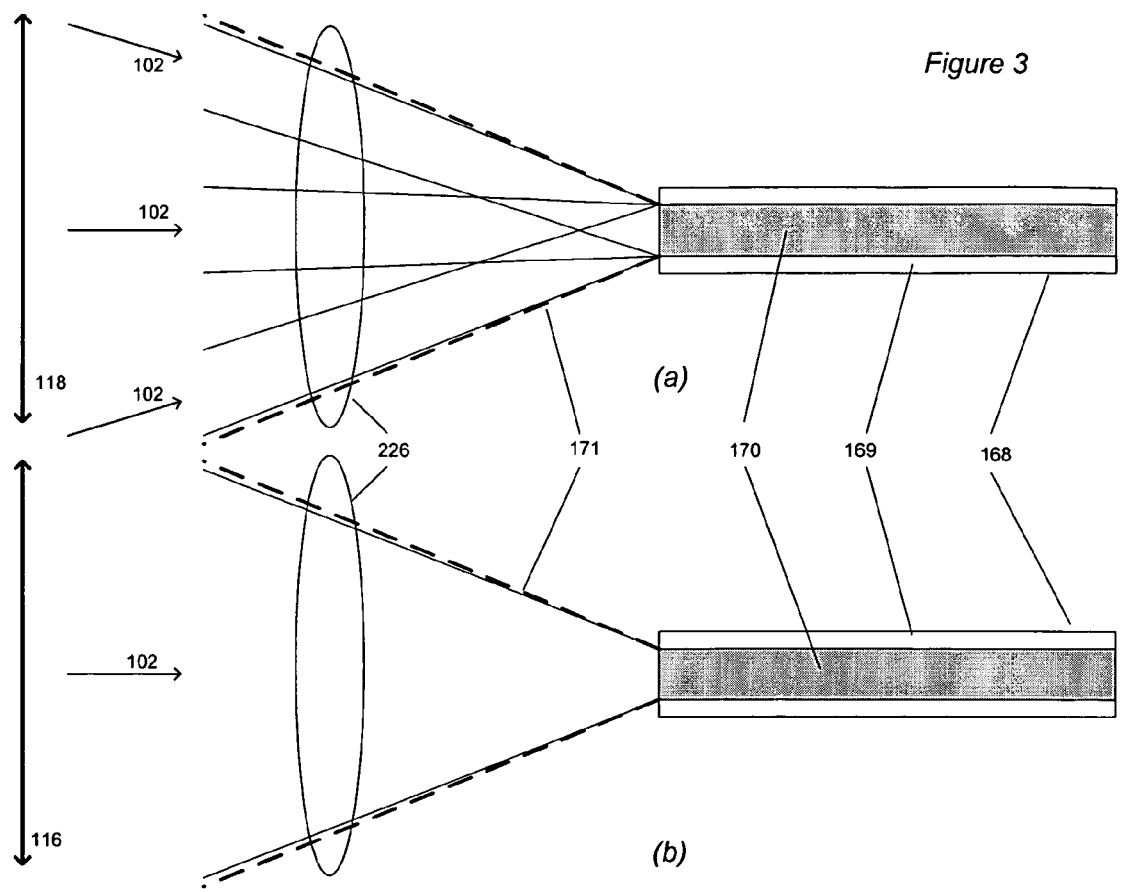
FIGS. 3(a) and 3(b) schematic drawings that illustrate views of the fast and slow axes, respectively, of the beams of the individual emitters as they converge on the fiber entrance aperture.

FIGS. 3(a) and 3(b) shows schematically in the fast and slow axes respectively how the beams from each of the laser diode emitters 104 forming the column of emitters 144 in FIGS. 2(a) and 2(b) converge at the multimode fiber optic 168 entrance face. The multimode fiber optic 168 consists of a cladding layer 169 and a core 170 characterized by its diameter and acceptance angle 171. In the fast axis direction 118, the output bundle of beams 226 comprising of the direction 102 for the beams from the individual laser diode emitters 104 are converging toward the multimode fiber optic 168 entrance face as each beam from each laser diode emitter is focused to the size optimal for coupling into the desired fiber dimensions 168, and the multiplicity of laser diode emitters 144 is each steered at a different angle such that the bundle of beams is contained within the acceptance angle 171 of the multimode fiber 168. In the slow axis direction 116, the beams from the multiplicity of laser diode emitters 104 with their propagation directions 102 overlap such that each beam is focused to the desired diameter and numerical aperture for the multimode fiber 168. In this way, the creation of a SBU is created by transforming a laser diode source 104 of asymmetric brightness into a fiber of symmetric brightness.

An SBU formed by combining the laser lights from one or more columns of laser diodes into an optical fiber can be combined with other fiber-coupled SBU from the same 2-D array to provide a high-intensity beam. Furthermore, as already mentioned above, the 2-D laser array may be used as a building block for a system for generating a high-brightness output laser beam. The number of 2-D laser arrays used in the system may depend on the desired output level, and the lights generated by laser diodes in the 2-D laser arrays may be combined through one or more combination stages to achieve the high-brightness output beam.

Figure 10:
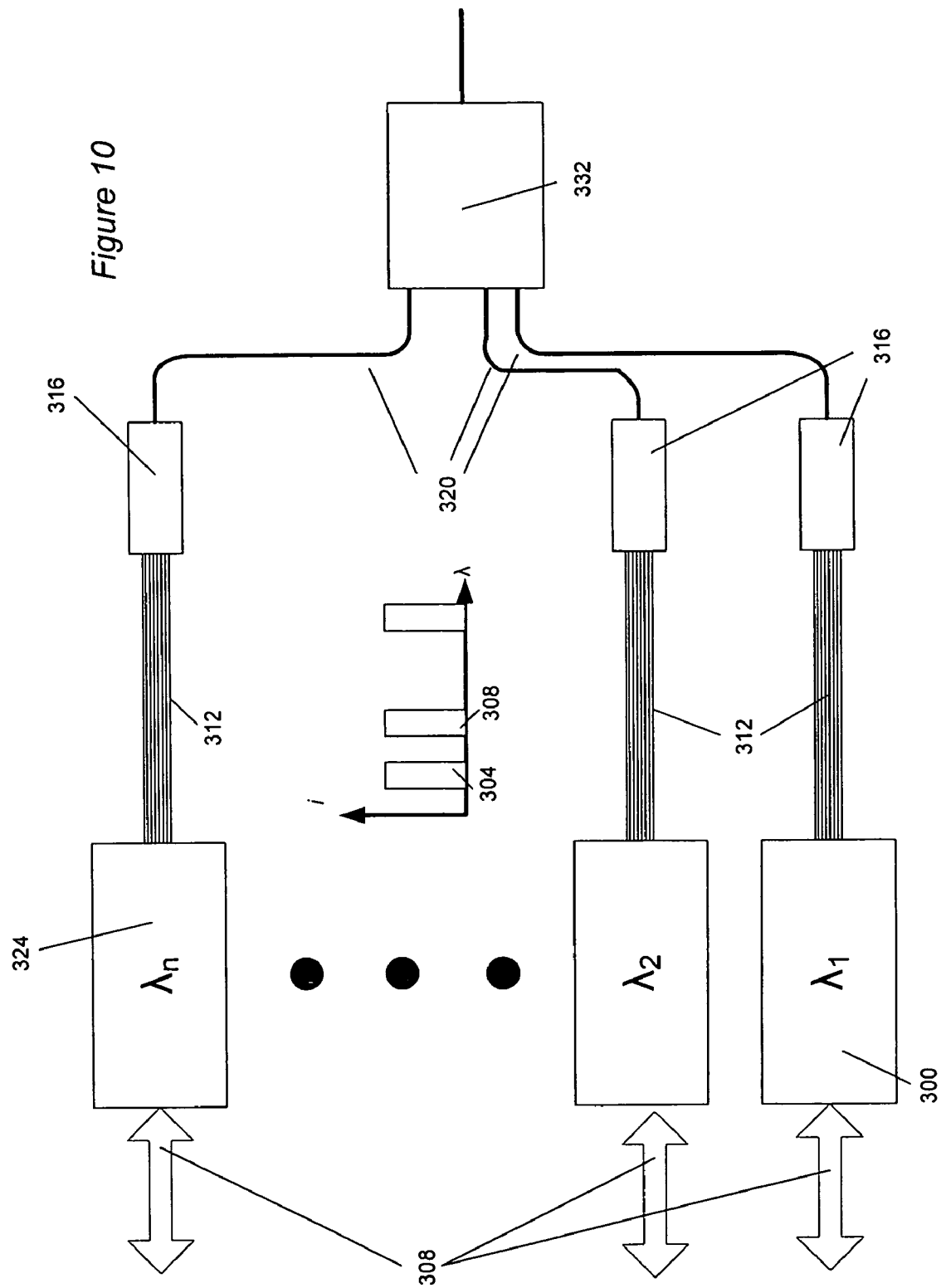
FIG. 10 is a schematic drawing that illustrates an embodiment of a system that uses multiple laser modules each having a 2-D array of laser diodes, wherein the outputs of the laser modules are spectrally combined to provide a single intense output beam.

By way of example, FIG. 10 shows an embodiment of a system comprising a multiplicity of fiber-coupled 2-D tacked arrays. This embodiment utilizes two techniques—fiber combination and spectral combination—to combine the laser lights from the multiple 2-D arrays into a final high-intensity output beam carried by an output fiber. A multi-fiber-coupled 2-D stacked array 300 is constructed such that all of the emitters in the array emit light in a defined wavelength region 304. Connections 308 are made to 300 for power and cooling as well as monitoring. Light from this multi fiber bundle 312 passes though a fiber combiner 316 to become a single fiber 320. A fiber combiner 316 can be, but is not limited to, a fused taper type device where the radius times NA product of the output fiber is in general equal to or greater than the sum of the radius times NA products of the input bundle. Such devices can be purchased in standard or custom formats from companies like JDSU or Itf.

A second multi fiber-coupled 2-D Stacked Array 324 is constructed such that all of the emitters in its array emit light in a defined wavelength region 328 distinct from the first region 304. The light from this multi fiber bundle 312 also passes through its own fiber combiner 316 to become a single fiber 320. In this way a multiplicity of such multi fiber-coupled and fiber combined 2-D Stacked Arrays can be created each having its own distinct wavelength region. The light from the multiplicity of fiber-coupled 2-D Stacked arrays 320 is combined in wavelength in a spectral combiner 332 to produce a single fiber combined output. In this way, the laser light outputs of the multiple 2-D stacked arrays 300 are combined into one intense laser beam guided through the final output optical fiber. The spectral combiner 332 is an optical wavelength multiplexing device whose single channel passband is designed to correspond to the defined wavelength region 304 that each mufti fiber-coupled 2-D Stacked Array 300 resides in. These spectral combiners 332 can be constructed in a number of ways including yet not limited to: ruled gratings, volume Bragg holograms, thin film mirrors, prisms or fiber Bragg gratings. The designs and constructions of such combiners are well known.

Figure 6:
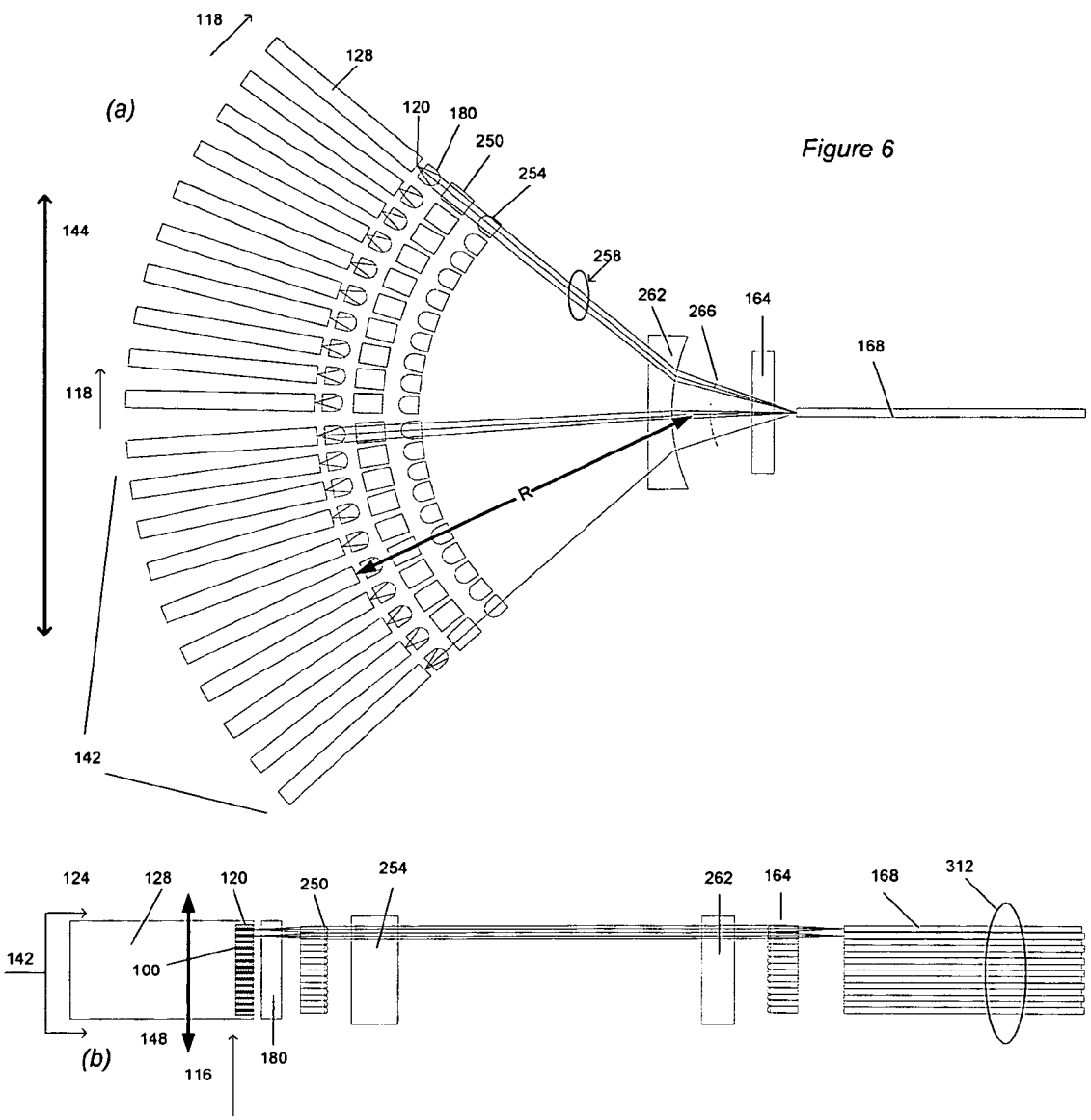
FIGS. 6(a) and 6(b) are schematic drawings that illustrate views of the fast and slow axes, respectively, for combining the outputs from a stack of laser diode arrays according to a first embodiment of the invention.

Different array arrangements and optical assemblies may be used to facilitate the imaging of lights from laser diodes in a 2-D array into optical fibers. FIGS. 6(a) and 6(b) shows the fast and slow axis views of the configuration of one embodiment for combining the outputs from a 2-D Stacked array 142. The 2-D Stacked Array 142 is formed by multistripe bars 120 of individual emitters 100 where the individual emitters 100 are aligned such that a row direction 148 consisting of a multiplicity of single emitters 100 is defined photolithographically on a single multistripe bar 120. The multistripe bar 120 is also aligned such that a column direction 144 is formed by a multiplicity of individual emitters 100 from a multiplicity of multistripe bars 120. In this case the 2-D Stacked array 142 is aligned such that the individual emitters 100 lie on the surface of a cylinder of radius R whose length is the width of the individual multistripe bar 120 with the axis of propagation of light from each of the individual emitters 100 is directed to the center axis of the cylinder.

Collimation in the fast 118 and slow axis 116 is accomplished using multiple optical imaging elements. A single fast axis collimating cylindrical lens 180 collimates the light from an entire row 148, and each individual emitter has its own individual slow axis collimating lens 250. The fast axis light from an entire row 148 is focused to the appropriate beam dimension through a single fast axis focusing lens 254. Slow axis collimated light and fast axis focused light from a multiplicity of single emitter beams 258 comprising the entire 2-D Stacked array is steered to the appropriate NA for the entire bundle of rays 266 through a single or assembly of cylindrical lenses 262 whose effective focal length is negative. Each column 144 is then slow axis focused through a single cylindrical lens 164 to the desired diameter and NA, and then each column 144 is coupled to an individual optical fiber 168. The diameter and NA of this fiber is chosen to match the brightness of the resulting SBU based on the optical processing of a column of single emitters 144. The fiber-coupled output from the entire 2-D stacked array 142 is consists of a bundle of optical fibers 312 where there is a 1:1 correspondence between the number of optical fibers 168, and the number of columns 144 in the array. It should be noted that this embodiment represents one way of accomplishing this objective. Additional optical elements can be added with slow or fast axis power, or both, it improve optical performance, i.e., reduce aberrations, at the cost of optical efficiency. In addition the output light from this system need not be exclusively coupled into optical fibers. The output light from this system could also be coupled in to a number of different optical systems.

Figure 7:
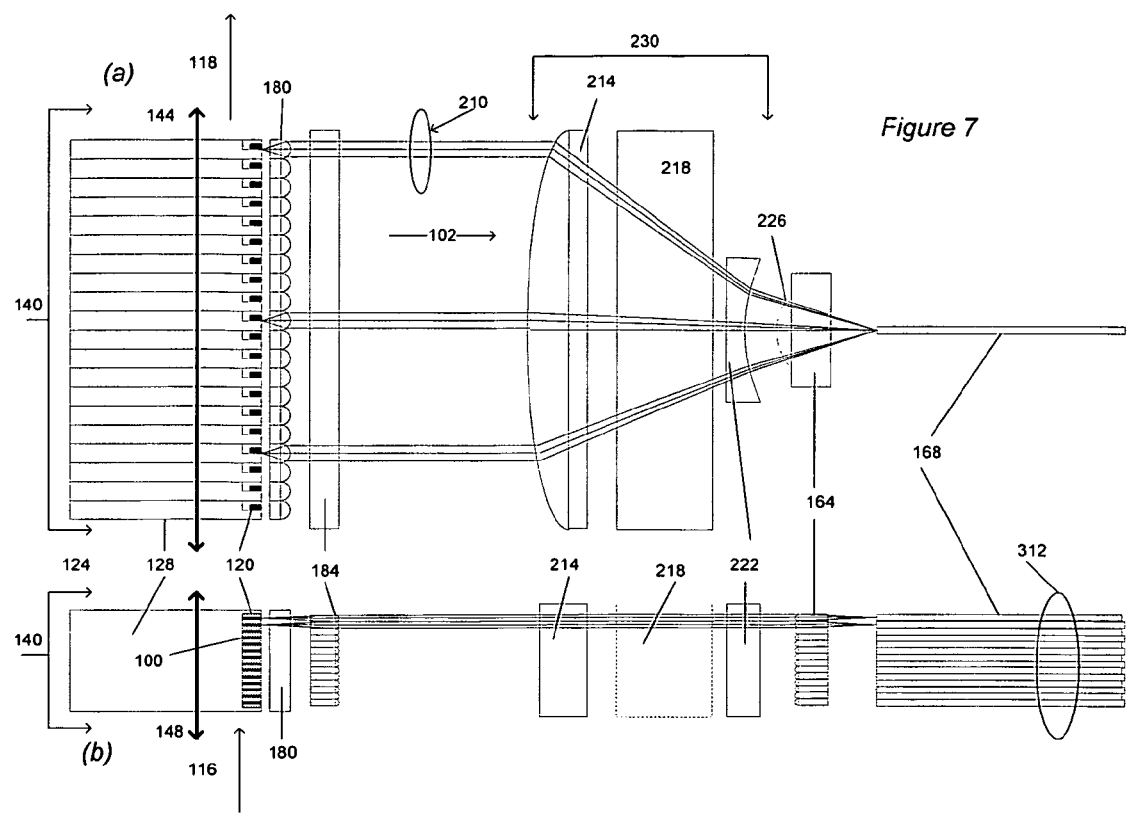
FIGS. 7(a) and 7(b) schematic drawings that illustrate views of the fast and slow axes, respectively, for combining the outputs from a stack of laser diode arrays according to a second embodiment of the invention.

FIGS. 7(a) and 7(b) shows the fast and slow axis views of an alternate embodiment for combining the outputs from a 2-D Stacked array 140. The 2-D Stacked Array 140 consisting of multistripe bars 120 of individual emitters 100 where the individual emitters 100 are aligned such that a row or row direction 148 consisting of a multiplicity of single emitters 100 is defined photolithographically on a single multistripe bar 120. The multistripe bars 120 are also aligned such that a column or column direction 144 is formed by a multiplicity of individual emitters 100 from a multiplicity of multistripe bars 120. In this alternate case, the 2-D Stacked array 140 is aligned such that the individual emitters 102 direction of propagation is parallel to all of the other single emitters 100. Collimation in the fast 118 and slow axis 116 is accomplished as follows: A single fast axis collimating cylindrical lens 180 collimates the light from an entire row 144, and a single slow axis collimating cylindrical lens 184 collimates the light from an entire column 148. A collimated beam 210 is the result. The fast axis light from the entire 2-D Stacked Array 140 is focused to the appropriate beam dimension and NA through the use of a Cylindrical Optical Assembly 230. The Cylindrical Optical Assembly is a multi element optical assembly consisting of at a minimum a positive effective focal length cylindrical lens 214 followed negative effective focal length cylindrical lens 220. Additional positive and negative lenses 218 can be added between 214 and 222 to reduce optical aberrations.

In the resulting output bundle of rays 226, the light from each emitter 100 is fast axis focused to the appropriate dimension and the entire bundle of rays 226 has the desired NA for efficient coupling to optical fiber 168 or other types of optical systems. Each column 144 is then slow axis focused through a single cylindrical lens 164 to the desired diameter and NA, and then each column 144 is coupled to an individual optical fiber 168. Additional slow axis cylindrical lenses may be incorporated into the design to act as relay lenses to keep the slow axis beam diameter within the boundaries defined by each column. The diameter and NA of this fiber is chosen to match the brightness of the resulting SBU based on the optical processing of a column of single emitters 100. The fiber-coupled output from the entire 2-D stacked array 100 is consists of a bundle of optical fibers 312 where there is a 1:1 correspondence between the number of optical fibers 168, and the number of columns 144 in the array. It should be noted that this embodiment represents one way of accomplishing this objective. Additional optical elements can be added with slow or fast axis power, or both, it improve optical performance, i.e., reduce aberrations, at the cost of optical efficiency. In addition the output light from this system need not be exclusively coupled into optical fibers. The output light from this system could also be coupled in to a number of different optical systems.

Figure 8:
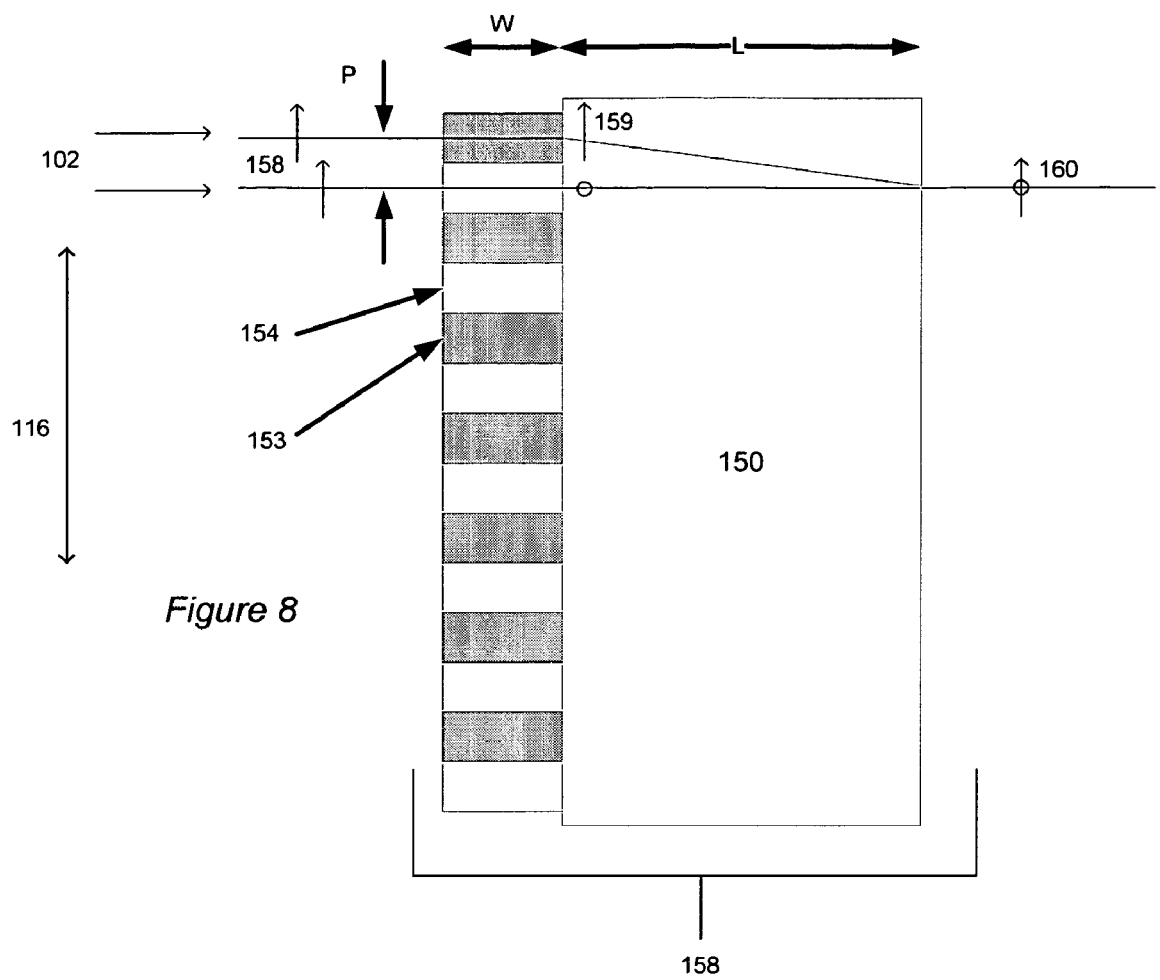
FIG. 8 is a schematic drawing that illustrates a configuration for combining output beams from adjacent columns of beams by means of polarization combination.

Brightness values greater than that of the original array can be achieved with techniques such as polarization and spectral combining. FIG. 8 shows the slow axis direction 116 of a polarization combining structure 158 consisting of a substrate of a birefringent material 150 such a calcite or Yttrium Vanadate YVO4 oriented in the configurations as a displacement prism. In a standard displacement prism, input beams of orthogonal polarizations are combined into a single beam. These displacement prisms are readily available from several different suppliers. The thickness L of the displacement prism for a material such a calcite is determined by the incoming separation of the input beams of distance P. Since the incoming beams from a laser diode bar 120 all have the same polarization direction 158, an array of half wave plates 154 oriented 45 degrees to the incoming plane of polarization placed in an array adjacent to the displacement prism 150. The half wave plates 154 are placed so as to affect every other column of laser diode beams. Air or glass spacers 153 are placed in the other column locations for no polarization rotation. In this configuration the polarization of the beams in say the odd columns are rotated 90 degrees 159 relative to their original orientation. As adjacent columns of beams pass through the birefringent material, one polarization passes through unaffected while the other is refracted at an angle determined by the orientation and birefringent properties of the material. The thickness of the material is chosen such that at the output of adjacent columns of beams are superimposed to form a combined output 160 traveling in a collinear direction. With this element in the beam train, the lights from two adjacent columns are combined and imaged into one optical fiber. As a result, the number of optical fibers required to carry the output lights of the 2-D array is reduced by a factor of two. This polarization combining structure can be placed anywhere in the beam path, but is preferably placed at a location where the divergence of the individual beams is at a minimum.

FIGS. 9(a) and 9(b) shows an embodiment similar to that depicted in FIGS. 7(a) and 7(b) but contains the polarization combining assembly 158 placed in the collimated region of the beam paths. As a result of the column-combining, the output fiber bundle 312 contains half the number of fibers as the configuration in FIGS. 7(a) and 7(b).

Figure 11:
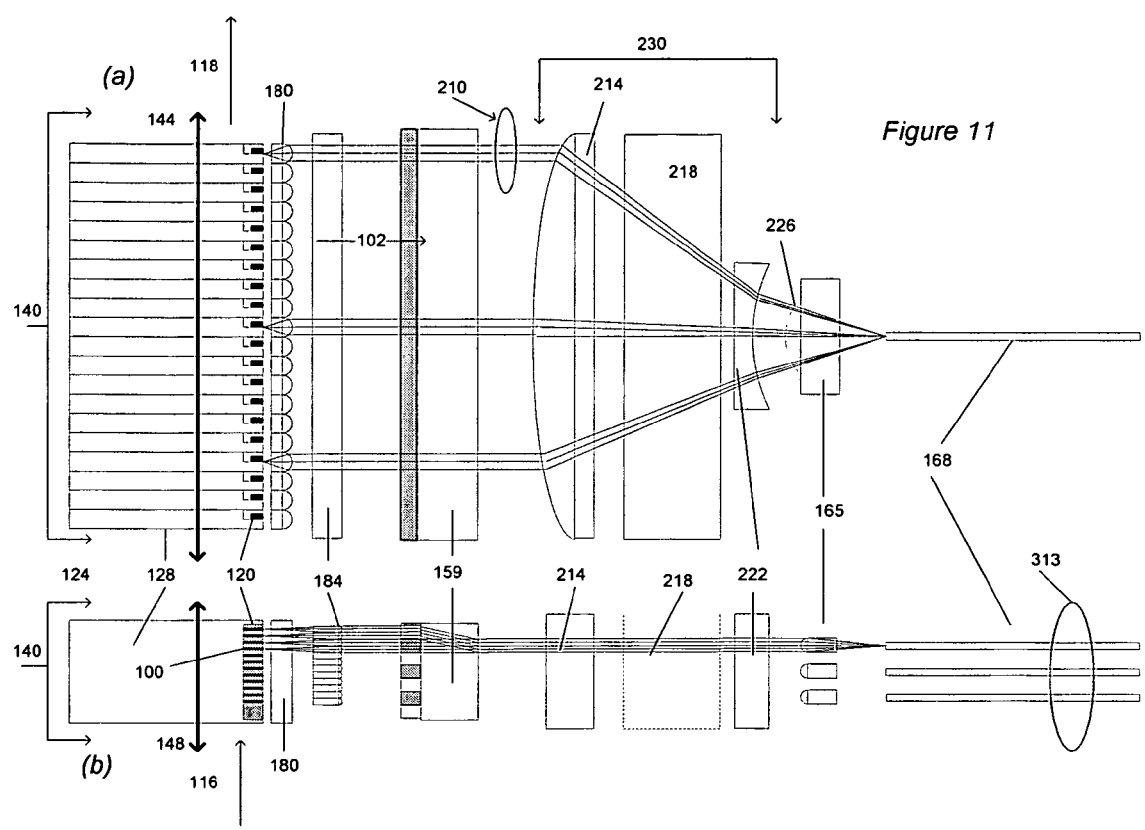
FIG. 11 is a schematic diagram that illustrates an alternative embodiment that utilizes polarization combination to combine output beams from columns of a 2-D laser array.

FIGS. 11(a) and 11(b) shows the fast and slow axis views of another alternate embodiment for combining the output beams of a 2-D Stacked array 140. The 2-D Stacked Array 140 has a plurality of multistripe bars 120 of individual emitters 100, with the individual emitters 100 aligned such that a row or row direction 148 consisting of a multiplicity of single emitters 100 is defined photolithographically on a single multistripe bar 120. The multistripe bars 120 are also aligned such that a column or column direction 144 is formed by a multiplicity of individual emitters 100 from a multiplicity of multistripe bars 120. In this embodiment, the 2-D Stacked array 140 is aligned such that the individual emitters 102 direction of propagation is parallel to all of the other single emitters 100.

Collimation in the fast 118 and slow axis 116 is accomplished as follows: A single fast axis collimating cylindrical lens 180 collimates the light from an entire row 144, and a single slow axis collimating cylindrical lens 184 collimates the light from an entire column 148. resulting in a collimated beam 210. The fast axis light from the entire 2-D Stacked Array 140 is focused to the appropriate beam dimension and NA through the use of a Cylindrical Optical Assembly 230. The Cylindrical Optical Assembly is a multi-element optical assembly consisting of at a minimum a positive effective focal length cylindrical lens 214 followed negative effective focal length cylindrical lens 220. Additional positive and negative lenses 218 can be added between 214 and 222 to reduce optical aberrations. In the resulting output bundle of rays 226, the light from each emitter 100 is fast axis focused to the appropriate dimension and the entire bundle of rays 226 has the desired NA for efficient coupling to optical fiber 168 or other types of optical systems.

Figure 9:
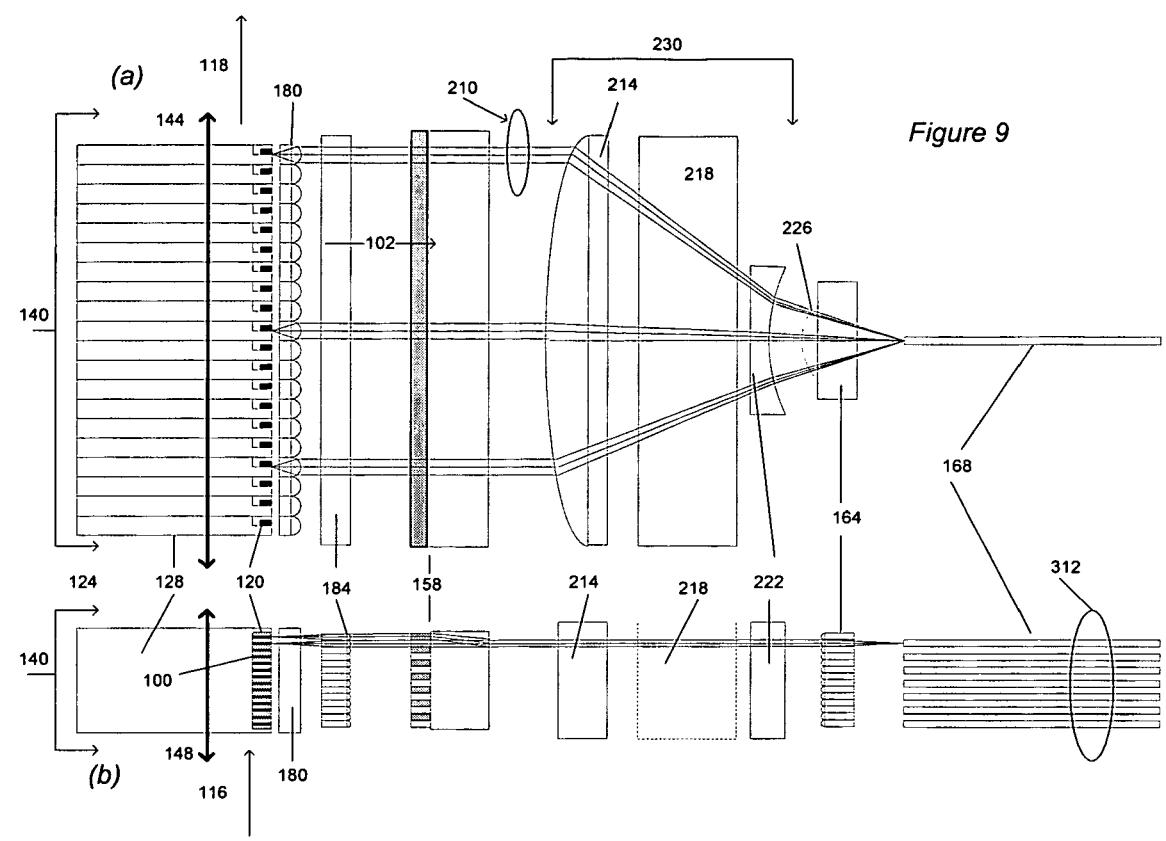
FIGS. 9(a) and 9(b) are schematic drawings that illustrate views of the fast and slow axes respectively, for the embodiment in FIGS. 7(a) and 7(b) with the insertion of the polarization combining assembly.

In the slow axis direction this embodiment differs from that of FIGS. 9(a) and 9(b) in that the polarization combining assembly 159 is designed such that the columns are polarization-combined in groups of 2 columns. In other words, the light from a group of two immediately adjacent columns are polarization-combined with light from the next group of two adjacent columns. This is accomplished by having the waveplate rotate the light from two adjacent columns and then the use of a birefringent displacement prism of the appropriate optical path length to combine these two adjacent columns with the next two adjacent columns. This technique can be applied to an arbitrary number of columns in each group, with the waveplate and the birefringent displacement prism sized appropriately. In the embodiment illustrated in FIG. 11, the two adjacent, collimated columns are then focused together using a slow axis focusing cylindrical lens 165 into one fiber 168 with the desired diameter and Numerical Aperture. The number of required fibers 313 is thus again reduced in half, similar to that in the embodiment of FIG. 9. This multicolumn focusing technique can also be applied to more than two columns. For instance, groups with three or more columns may be combined using this technique.

Figure 4:
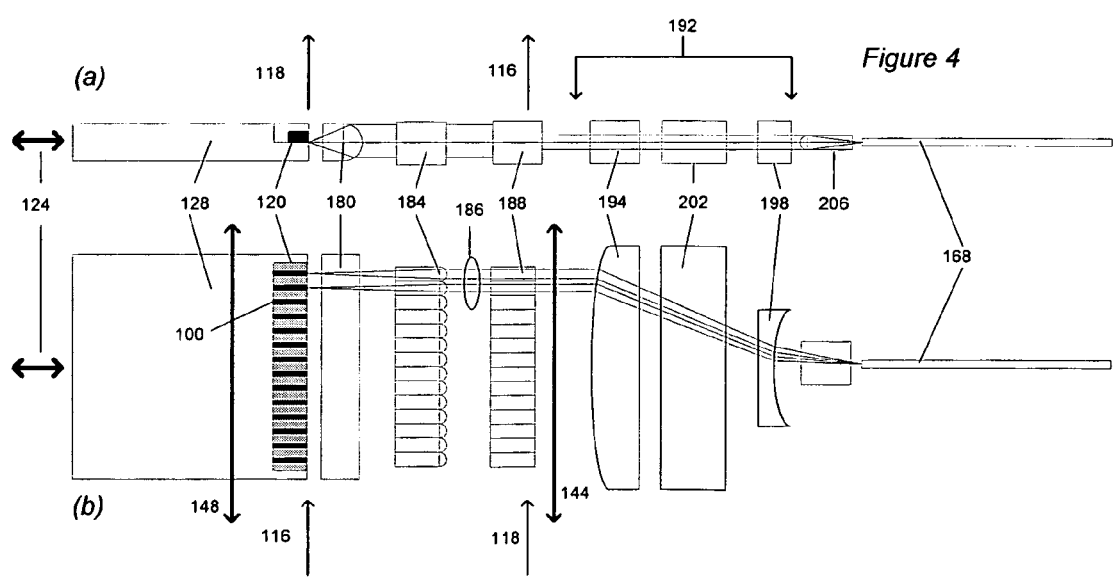
FIGS. 4(a) and 4(b) are schematic drawings that illustrate views of the fast and slow axis, respectively, for combining the outputs from single laser diode array such as that in FIG. 1 (b)
Figure 5:
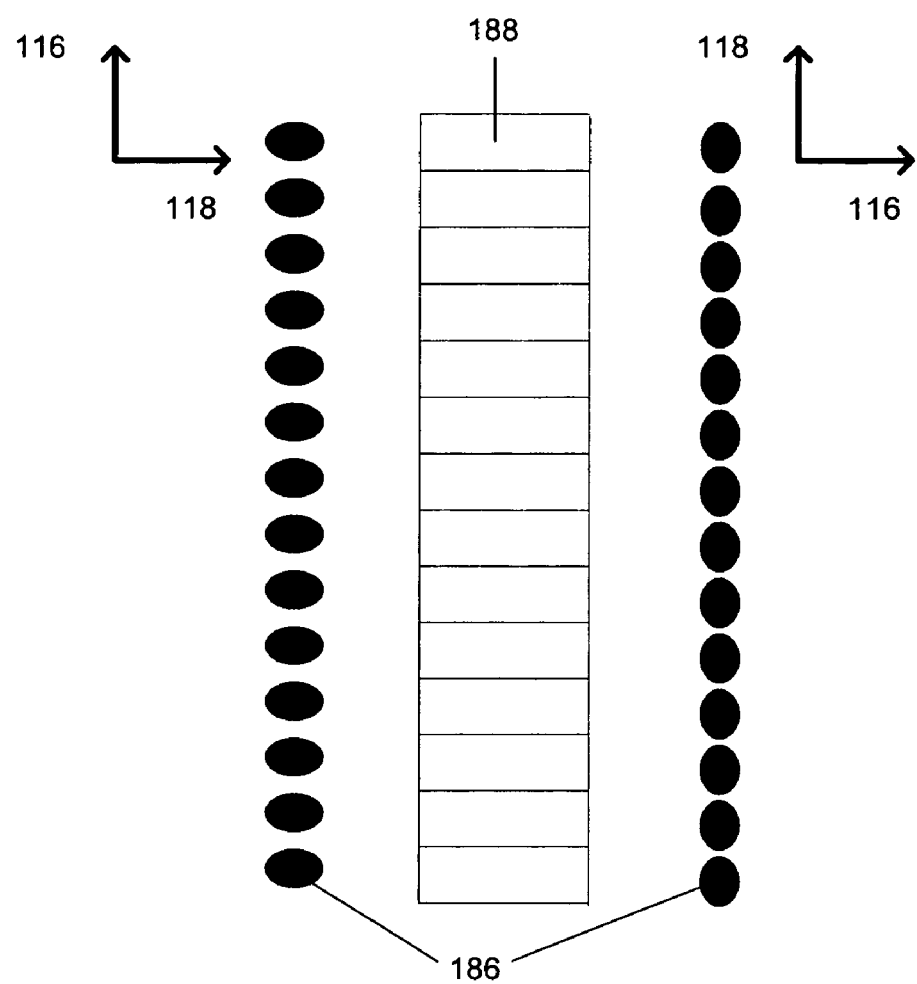
FIG. 5 is a schematic representation of the rotational transformation of the beams from the laser array of FIGS. 4(a) and 4(b)

In coupling a single multistripe laser diode bar 120 into a fiber or other optical system, the problem is encountered where the individual laser diode emitting regions 100 are aligned to create a row or row direction 148 where it is desired to create a column or column direction 144 for the creation of an SBU and the efficient coupling of the light into an optical fiber or other optical system. FIGS. 4(a) and 4(b) shows the fast and slow axis views of an alternative embodiment for combining the outputs from s single multistripe laser diode bar 120. The emission from a multistripe laser diode bar 116 with parallel electrical connections 124 mounted on a cooling substrate 128 is collected with fast axis collimating optics 180 and slow axis collimating optics 184. The parallel beams 186 then pass through a rotational array 188 which produces a 90 degree image rotation for each beam. Commonly accepted ways for accomplishing this image rotation include, but is not limited to, the use of such optical devices such as dove prisms, Abbe-Kronig prisms and the use of three (3) orthogonal mirror reflections. FIG. 5 shows schematically this transformation from the row direction 100 to the column direction 100 through the rotational array 100. The use of the rotational array transforms the multistripe laser diode bar 120 from a row or row direction 148 into a column or column direction 144 in preparation for transformation by the cylindrical optical assembly 192. This cylindrical optical assembly 192 is a multi element optical device consisting of at a minimum a positive effective focal length cylindrical lens 194 followed by a negative effective focal length cylindrical lens 198. Additional optical lenses 202 can be added between 194 and 198 for the reduction of aberrations. An additional lens 206 focuses the slow axis direction to the appropriate beam size and NA to match the multimode fiber 208.

In view of the many possible embodiments to which the principles of this invention may be applied, it should be recognized that the embodiment described herein with respect to the drawing FIGS. is meant to be illustrative only and should not be taken as limiting the scope of invention. Those of skill in the art will recognize that the elements of the illustrated embodiments can be modified in arrangement and detail without departing from the spirit of the invention. Therefore, the invention as described herein contemplates all such embodiments as may come within the scope of the following claims and equivalents thereof.

The invention claimed is:

1. An apparatus for generating laser light, comprising:
a stack of one-dimensional laser diode array bars forming a two-dimensional laser array having laser diodes arranged in rows and columns, where laser diodes in each of the one-dimensional laser diode array bars comprise the laser diodes in one of the rows of the two-dimensional laser array and laser diodes aligned across the stacked one-dimensional laser diode array bars comprise the laser diodes in one of the columns of the two-dimensional laser array, each laser diode having a fast axis oriented in a column direction and a slow axis oriented in a row direction;
an optical assembly for collimating laser light from the stack in both the fast and slow axes and focusing the laser light from each of two or more groups of columns from the two dimensional laser array into a corresponding one of two or more optical fibers without rotating the fast and slow axes, where there is a one-to-one correspondence between the number of groups of columns and the number of fibers such that each fiber receives the focused laser light from only one of the groups of columns; and
means for compensating for spherical aberration in the focused laser light from each group of columns in order to match the focused laser light to a diameter and numerical aperture of the corresponding optical fiber, wherein the means includes an arrangement of the stack of one-dimensional laser diode array bars that aligns individual emitters along a surface of a cylinder of radius R such that an axis of propagation from each of the emitters is directed to the center axis of the cylinder.

2. The apparatus of claim 1, wherein the optical assembly includes optics for imaging laser light from one of the groups of columns into an entrance end of the corresponding optical fiber to form a summed beam whose brightness is substantially equal in the row and column directions.

3. The apparatus of claim 1, wherein the optical assembly includes multiple optical elements disposed between the two-dimensional laser array and an entrance end of each of the two or more optical fibers for focusing laser light from each of the groups of the laser sources.

4. The apparatus of claim 3, further including a fiber combiner for combining the two or more optical fibers into a single fiber.

5. The apparatus of claim 1, wherein each of the one-dimensional laser bars has multiple laser diodes photolithographically formed therein, each one-dimensional laser bar forming a row of the two-dimensional laser array.

6. A method of generating laser light, comprising:
energizing a stack of laser sources to generate laser light, wherein each layer in the stack comprises a multi-emitter laser bar forming a row of the laser sources and columns of the laser sources extend across the layers such that a fast axis of each laser sources is oriented in a column direction of the stack and a slow axis of each laser source is oriented in a row direction of the stack and;
collimating the laser light from the stack in both the fast and slow axes;
focusing laser light from one or more of the columns of the laser sources into an optical fiber without rotating the fast and slow axes of the laser sources in the column, where a brightness of the focused light is substantially equal in the fast and slow axes directions; and
compensating for spherical aberration in the focused laser light in order to match the focused laser light to a diameter and numerical aperture of the optical fiber by aligning individual emitters of the stack of laser sources along a surface of a cylinder of radius R such that an axis of propagation from each of the emitters is directed to the center axis of the cylinder.

7. The method of claim 6, wherein the focusing of laser light forms a summed beam in the optical fiber and a brightness of the summed beam in the column direction is substantially equal to a brightness of the summed beam in the row direction.

8. A system for producing a beam of laser light from laser sources, comprising:
each of a plurality of laser modules comprising rows and columns of laser sources whose fast axes are oriented in a column direction and slow axes oriented in a row direction, where each of the rows comprises a multi-emitter laser bar and each of the columns comprises laser sources aligned across laser bars, and an optical assembly for focusing laser light along the columns of the laser sources into two or more optical fibers without rotating the fast and slow axes such that the focused laser light entering each of the fibers has substantially equal brightness in the slow and fast axes directions;
the optical assembly for each of the modules including optics for collimating the laser light in both the fast and slow axes and an arrangement aligning individual laser diodes in the rows and columns of the module along a surface of a cylinder of radius R such that an axis of propagation from each of the laser diodes is directed to the center axis of the cylinder, where the arrangement compensates for spherical aberration in the focused laser light in order to match the focused laser light to a diameter and numerical aperture of the optical fiber;
a plurality of fiber combiners for combining the optical fibers from each of the plurality of laser modules into a combined optical fiber; and
a spectral combiner receiving the combined optical fiber from each of the modules such that laser light generated by multiple laser modules is spectrally combined into a final output optical fiber.

9. The system of claim 8, wherein the optical assembly of each laser module images laser light produced by laser sources in two or more groups of contiguous columns of laser sources, with laser light from each of the groups dedicated to one of the two or more optical fibers such that there is a one-to-one correspondence between the groups and the optical fibers in each laser module.

10. The system of claim 9, wherein the optical assembly of each laser module assembly includes multiple optical elements disposed between the laser sources and entrance ends of the optical fibers.

11. An apparatus for generating laser light, comprising:
- a two-dimensional laser array having laser sources arranged in rows and columns, each laser source having a fast axis oriented in a column direction and a slow axis oriented in a row direction;
- an optical assembly for collimating laser light from the array in both the fast and slow axes and focusing the laser light along the columns of the array and from two or more groups of columns such that laser light from each of the groups is focused into its own optical system without rotating the fast and slow axes, where each group comprises one or more contiguous columns but less than all of the columns and each of the groups is associated with one or more optical elements for focusing laser light in the slow axis that are not shared with any of the other groups; and
- an arrangement of the laser sources that aligns individual sources along a surface of a cylinder of radius R such that an axis of propagation from each of the sources is directed to the center axis of the cylinder, thereby compensating for spherical aberration in the focused laser light from each group of columns in order to match the focused laser light to a desired diameter.

12. The apparatus of claim 11, wherein the optical assembly includes optics for imaging laser light produced by each of the two or more groups of columns into an entrance end of one of the optical systems to form a combined light beam, wherein a number of the contiguous rows in each column is selected so that a brightness of the combined light beam in the direction of the fast axis is substantially equal to a brightness of the combined light beam in the direction of the slow axis.

13. The apparatus of claim 11, wherein at least one of the groups of columns comprises two or more of the contiguous columns for focusing laser light into an entrance end of the optical system.

14. The apparatus of claim 13, wherein the optical system is an optical fiber.

15. The apparatus of claim 11, wherein the optical assembly includes multiple optical elements disposed between the two-dimensional laser array and entrance ends of the optical systems for focusing laser light from the laser sources of each group into a combined light beam whose Symmetric Brightness Unit (SBU) is substantially one and is matched in its physical dimensions to a numerical aperture of one of the entrance ends of a selected one of the optical systems in order to efficiently couple the combined light beam to the selected optical system.

16. The apparatus of claim 12, where the entrance end of each of the two or more optical systems is an end of an optical fiber.

17. The apparatus of claim 16, further including a fiber combiner for combining the optical fibers whose entrance ends receive focused laser light from the two or more groups of columns of laser sources.

18. The apparatus of claim 11, wherein the two-dimensional laser array comprises a stack of laser bars having multiple laser diodes formed therein in one dimension such that each laser diode bar forms a row of the two-dimensional laser array.

* * * * *